June 11, 1957

G. C. SZIKLAI

MODULATION

Filed Dec. 5, 1952

2,795,762

INVENTOR.

GEORGE C. SZIKLAI

BY [signature]

ATTORNEY

United States Patent Office
2,795,762
Patented June 11, 1957

2,795,762

MODULATION

George C. Sziklai, Princeton, N. J., assignor to Radio Corporation of America, a corporation of Delaware Application December 5, 1952, Serial No. 324,304

4 Claims. (Cl. 332—52)

This invention relates to signalling systems and particularly to modulation systems wherein carrier wave energy is controlled in amplitude in accordance with modulating signals.

The present invention proposes a simple modulation system wherein the impedance presented by a semiconductor device to the load circuit of a source of carrier wave energy is varied in accordance with modulating signals. In illustrative embodiments of the present invention, modulating signals are applied to vary the degree of forward bias established between the intermediate zone and one of the outer zones of a junction transistor. The resultant variations in the impedance of a current path in the transistor between its outer zones provide modulation in amplitude of the current flowing in a circuit including a carrier wave source, a load or output impedance, and this current path of the transistor.

An object of the present invention is to provide an improved and simplified modulation system.

Another object of the present invention is to provide a simplified system for controlling the amplitude of alternating current waves in accordance with control potentials and currents.

A further object of the present invention is to provide an improved system for modulating carrier waves in amplitude in accordance with modulating signals.

Other and incidental objects and advantages of the present invention will be apparent to those skilled in the art from a reading of the following specification and an inspection of the accompanying drawings in which.

Figure 1:
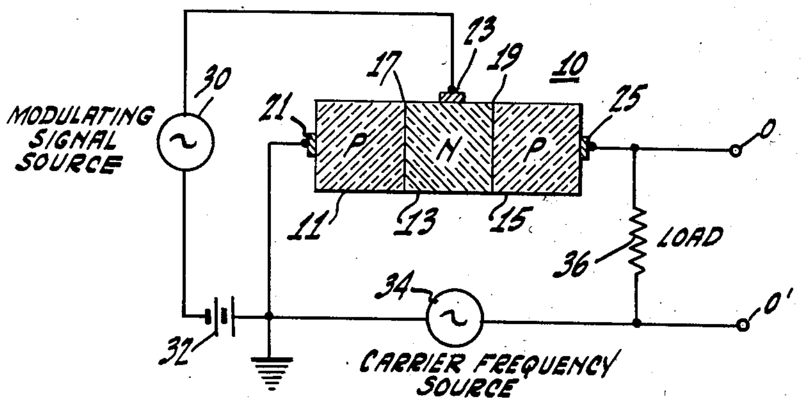
Figure 1 illustrates in schematic form a carrier wave modulation system embodying the principles of the present invention.

Figure 1 shows a carrier wave modulation system employing as a modulating element a semiconductor device 10, which is illustrated as a junction transistor of the p-n-p type. The transistor 10 comprises a body of semiconductive material, such as germanium or silicon, having two p-type regions 11 and 15, separated by and contiguous with opposite surfaces of an n-type region 13. Electrical "barrier," as discussed in U. S. Patent No. 2,569,347 to William Shockley, issued on September 25, 1951, occur at the interfacial junctions 17, 19. The electrodes 21, 23 and 25, by which external circuit connections are made to the respective regions 11, 13 and 15, make essentially ohmic (non-rectifying) contacts with their respective regions.

The practitioner of the present invention who should desire a theoretical background on junction transistors in general may refer to the aforesaid Shockley Patent and to the following publications for a preliminary knowledge of the nature of the junction transistors, some of its better known characteristics, and projected theories of its operation: "The theory of p-n junctions in semiconductors and p-n junction transistors" by W. Shockley, appearing in volume 28 (1949) of the Bell System Technical Journal, starting at page 435; "Electrons and Holes in Semiconductors" by W. Shockley, published by D. VanNostrand Co. in 1950; "p-n Junction transistors" by W. Shockley, M. Sparks, and G. K. Teal, appearing in volume 83 of the Physical Review, starting at page 151 in the July 1, 1951 issue; "Some circuit properties and application of n-p-n transistors" by R. L. Wallace, Jr. and W. J. Pietenpol, appearing in volume 39 of the Proceedings of the I. R. E., starting at page 753 in the July 1951 issue.

In accordance with the conventional nomenclature in the transistor art, the electrodes 21, 23 and 25 will be referred to as emitter, base and collector respectively.

The present invention utilizes to advantage the property of a transistor whereby, under appropriate conditions, current may be caused to flow in either direction through the emitter-collector path of the transistor, i. e. relying upon the bi-directional current characteristics of transistors, as revealed and discussed in the copending application of George C. Sziklai, Serial No. 308,618, filed on September 9, 1952, Patent No. 2,728,857, and entitled "Electronic Switching." Thus, in view of the bidirectional character of the current flow through the emitter-collector path of the transistor 10, it will be appreciated that the designations of electrode 21 as "emitter" and electrode 25 as "collector" are essentially arbitrary and not intended to be restrictively indicative of their respective functions.

In Figure 1, the emitter 21 of transistor 10 is connected to a point of reference potential (i. e. ground). A base-emitter input circuit, including in series a source 30 of modulating signals and a D. C. bias source, such as battery 32, is connected between the base 23 and the grounded emitter 21. An emitter-collector load circuit or output circuit, including in series a load, symbolically indicated by resistor 36, and a source 34 of carrier frequency waves, is connected between the collector 25 and the grounded emitter 21. The amplitude modulated carrier wave output is available at the output terminals O, O′, connected respectively to opposite ends of the load impedance 36. The battery 32 is poled so as to provide a bias in the forward direction between the base 23 and the emitter 21, and the direction of conventional current flow in the base-emitter path of the transistor 10 is thus in the emitter-to-base direction. This is the "easy" direction of current flow in a p-n-p transistor's base-emitter path, which presents a low impedance to current so flowing therein. As explained in the aforementioned copending Sziklai application, current may flow in the emitter-collector path of a transistor when current flow in the base-emitter path is in the "easy," low impedance direction, the direction of the emitter-collector current depending upon the polarity of the potential difference between emitter poential and collector potential. Thus, as long as a forward bias is maintained between base 23 and emitter 21, the emitter-collector path of transistor 10 completes an output circuit whereby an alternating current of carrier frequency supplied by source 34 may flow through the load 36.

The magnitude of this carrier frequency current, and the magnitude of the carrier frequency voltage developed across the load 36, will however depend upon the impedance presented by the emitter-collecting path of transistor 10 to the output circuit. This impedance is not fixed, but rather is variable in accordance with the effective bias established between the base 23 and the emitter 21. Since the base-emitter input circuit includes the modulating signal source 30 in series with the biasing source 32, the impedance of the emitter-collector path will vary above or below a value determined by the D. C. bias provided by battery 32 in accordance with the instantaneous magnitude and polarity of the modulating signal output of source 30. Thus the amplitude of the carrier frequency current flowing through the load 36, and the amplitude of the carrier frequency voltage developed thereacross, will be modulated in accordance with the signal output of source 30.

Figures 2, 3:
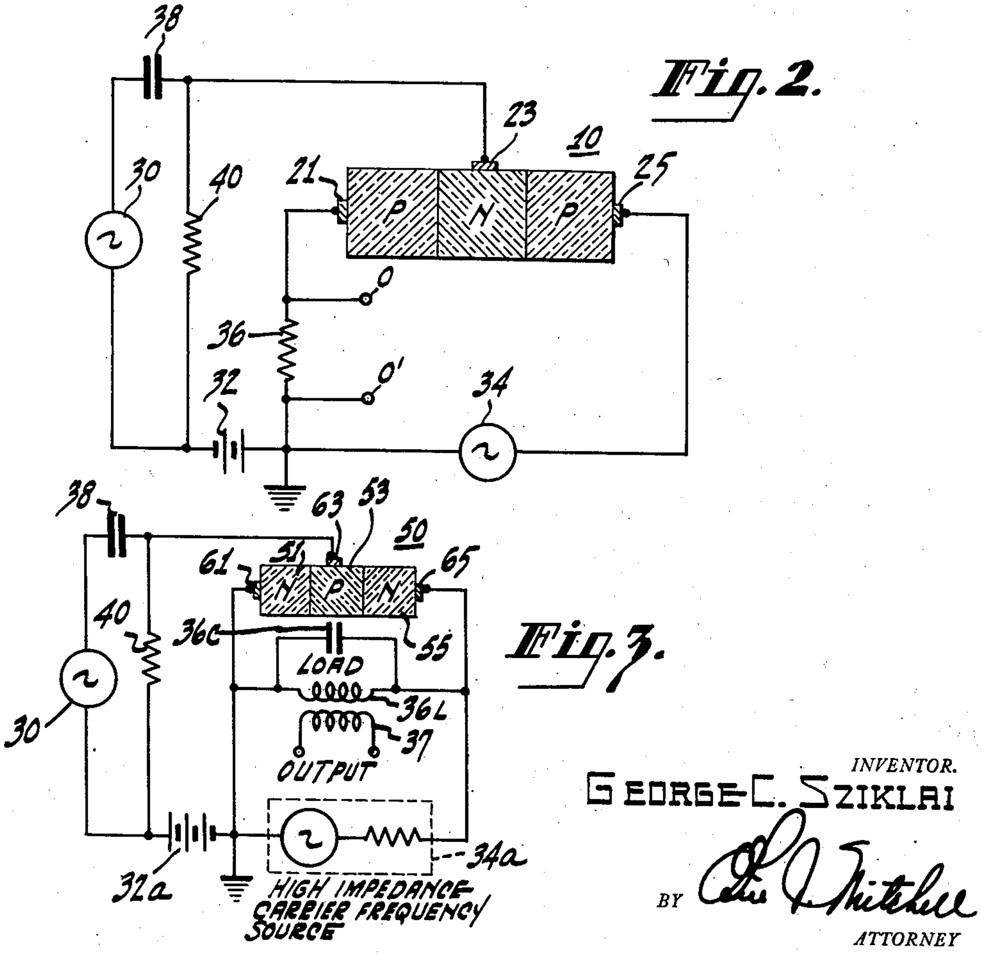
Figure 2 illustrates in schematic form, as another embodiment of the present invention, a modification of the modulation system shown in Figure 1.
Figure 3 illustrates schematically another form of a modulation system embodying the principles of the present invention.

It will be appreciated that the modulating signals supplied by source 30 may take any of a variety of forms, such as video signals, audio signals representative of speech, audio signals representative of music, etc. Thus, for example, the modulating signal source may be a microphone, or a television pickup device, or may be the final audio amplifier in a radio transmitter arrangement, or the final video amplifier in a television transmitter arrangement. Similarly, the load 36, while illustrated as a resistor, may take any of a variety of forms such as a coupling transformer, an antenna circuit, the input circuit of a carrier frequency amplifier, etc. It will further be appreciated that, appropriate to the form taken by the load 36, the output terminals O, O′ may be coupled to suitable terminals of subsequent signal amplifying or other signal processing circuits, wave propagation devices, or other signal utilization devices.

Where the character of the modulating signal source 30 is such as to preclude the practicability of directly coupling the source to the base-emitter circuit of the semiconductor device 10, the modulating signal may be supplied via a transformer, for example, or via an RC network as illustrated in Figure 2, which shows a modified form of the modulation system illustrated in Figure 1. The modification in Figure 2 also demonstrates that the load 36 may, if desired, be shared in common by the emitter-collector output circuit and the base-emitter input circuit.

In Figure 2, the emitter 21 of the transistor 10 is connected to ground via the load 36. One terminal of the modulating signal source 30 is coupled by a capacitor 38 to the base 23. The other terminal of the modulating signal source 30 is returned to ground via the biasing source, battery 32. A resistor 40 is connected between the base 23 and the non-grounded terminal of the battery 32. The emitter-collector output circuit, which includes the emitter-collector path of transistor 10, the load 36, and the carrier frequency wave source 34 is completed by connecting the output terminals of the source 34 to the collector 25, and to ground, respectively.

The operation of the modulation system of Figure 2 is similar to that previously described. The modulating signal output of source 30, appearing across the resistor 40, varies the amount of effective forward bias between the base 23 and the emitter 21 to control the impedance of the emitter-collector path of transistor 10. As the emitter-collector path impedance is thus varied in accordance with the modulating signals, the carrier frequency current flowing through the load 36, and the carrier frequency voltage developed thereacross, are accordingly modulated in amplitude.

In view of the fact that the load 36 is also included in the base-emitter input circuit, it will be understood that the output current flowing through the load 36, and the output voltage developed thereacross, each also contain a D. C. component varying in amplitude in accordance with the modulating signals.

In the embodiment illustrated in Figure 3, the semiconductor modulating device is shown as a junction transistor of the n-p-n type to demonstrate that transistors of this type are equally as feasible in practicing the present invention as are those of the p-n-p type. This embodiment also exemplifies another manner in which the load (here, comprising a parallel tuned circuit) may be coupled to the semiconductor device, viz. shunting the emitter-collector path, which is of particular interest when the carrier frequency waves are supplied by a high impedance source.

The n-p-n transistor 50 comprises a body of semiconductive material, such as germanium or silicon, having two n-type regions 51 and 55, separated by and contiguous with opposite surfaces of a p-type region 53. Emitter, base and collector electrodes, 61, 63 and 65, respectively, make essentially ohmic (nonrectifying) contacts with the respective regions, 51, 53, and 55.

The base emitter input circuit is somewhat similar to that shown in Figure 2, through lacking the inclusion of the load therein. The emitter 61 is connected to ground. One terminal of the modulating signal source 30 is coupled by the capacitor 38 to the base 63, while the other terminal of source 30 is connected to the grounded emitter 61 via the biasing source, battery 32A. The resistor 40 is connected between the base 63 and the non-grounded terminal of the battery 32A.

Due to the character of the base-emitter junction in an n-p-n transistor, the battery 32A must be poled in an opposite manner to that employed for the biasing source 32 in Figures 1 and 2 to establish a bias in the forward direction between base 63 and emitter 61. This permits the direction of conventional current flow in the base-emitter path of transistor 50 to be in the base-to-emitter direction, which is the "easy" direction of current flow in an n-p-n transistor's base-emitter path. Current may flow in the emitter-collector path of transistor 50 when current flow in the base-emitter path is in this "easy" direction, the direction of the emitter-collector current according with the polarity of potential difference between emitter 61 and collector 65.

In Figure 3 a high impedance source 34A of carrier frequency waves is connected between the collector 65 and the grounded emitter 61, the source and its significantly high internal impedance being represented in an equivalent schematic manner by symbols for a generator in series with a resistive impedance. A load 36, comprising a parallel tuned circuit consisting of an inductance coil 36L shunted by a capacitor 36C (which may be the coil's distributed capacity), is shunted across the emitter-collector path of the transistor 50.

As in previous explanations, as the effective forward bias between base 63 and emitter 61 is varied in accordance with the modulating signal output of source 30 appearing across the resistor 40, the impedance of the emitter-collector path of transistor 50 is correspondingly varied. As a result, the carrier frequency voltage appearing across the load, and the carrier frequency current flowing through the load coil 36L, are modulated in amplitude in accordance with the modulating signal output of source 30. An amplitude modulated output signal may be derived from the coil 37, inductively coupled to the tuned load, for appropriate utilization, as, for example, in a subsequent carrier frequency amplifying stage of a signalling system.

It may be appreciated that it would be desirable, though not essential, that the junction transistor 10 (or 50) employed in the present invention be "symmetrical" in the sense discussed in the aforementioned copending application of Sziklai: i. e. that current characteristics for both directions of current flow through the emitter-collector path be essentially symmetrical. Not all junction transistors attain this condition of symmetry; primarily as a consequence of the particular procedure employed in their fabrication or development, some junction transistors present a substantially greater impedance to current flow in one direction between the outer zones, for a given set of bias conditions, than they present to current flow in the opposite direction between the outer zones under equivalent bias conditions.

While there are many contributing factors which may determine the presence or lack of such symmetry in a junction transistor, it is believed by the applicant that if the resistivities of the two outer zones are substantially equal and if the two junctions are symmetrical (i. e. if the junction between one outer zone and the intermediate zone is substantially equal in magnitude or extent to the junction between the other outer zone and the intermediate zone), a sufficient degree of symmetry in current characteristics is achieved to permit consideration of the unit as a "symmetrical" junction transistor.

Thus, it should be stated that, though successful modulating action may be achieved with the present invention using "asymmetrical" transistor units, the circuit is operated to full advantage with maximum freedom from distortion if the transistor 10 (or 50) is a substantially "symmetrical" unit. In this connection, however, it may further be noted that, as taught in the aforementioned copending Sziklai application, the symmetrical effects obtained by utilizing a "symmetrical" transistor may be substantially duplicated by utilizing a parallel combination of two "asymmetrical" transistors wherein the parallel connection is made in an asymmetry-balancing manner such that the net current characteristics are "symmetrical."

It may further be appreciated that other embodiments of the present invention employing transistors of the so-called point-contact type with appropriate electrode circuit connections similar to those illustrated are also contemplated by the applicant. However, where the available point-contact transistor units have a tendency toward instability in a base-input type of circuit arrangement, the embodiments employing transistors of the junction type will be preferable.

What is claimed is:

1. In a signalling system including a source of carrier wave energy and a source of modulating signals, modulating apparatus comprising the combination of a symmetrical semiconductor device including a body of semiconductive material having two substantially similar outer zones of one conductivity type separated by an intermediate zone of the opposite conductivity type, a biasing source, an input circuit including said source of modulating signals and said biasing source connected between the intermediate zone and one of the outer zones of said semiconductor device, said biasing source establishing a bias in the forward direction between the intermediate zone and said one of the outer zones of said semiconductor device, and an output circuit including means for symmetrically energizing the semiconductor device current path existing between said outer zones of said semiconductor device with said carrier wave energy such that the current in said current path flows in respectively opposite directions throughout successive half cycles of said energizing carrier waves, said input circuit controlling the impedance of said current path in accordance with said modulating signals throughout successive half cycles of said energizing carrier waves.

2. In a signalling system including a source of carrier frequency waves and a source of modulating signals, the combination comprising a transistor having emitter, base, and collector electrodes, means for providing a bias in the forward direction between said base electrode and one of said emitter and collector electrodes, said transistor providing a bidirectionally conducting current path between said emitter and collector electrodes, means for varying the magnitude of said forward bias in accordance with said modulating signals, and an output circuit including means for applying carrier frequency waves symmetrically between said emitter and said collector electrodes such that the current in said current path flows in respectively opposite directions throughout successive half cycles of the applied carrier frequency waves, the impedance of said bidirectionally conducting current path varying in accordance with said bias magnitude variations throughout successive half cycles of the applied carrier frequency waves.

3. Apparatus for modulating carrier wave energy in amplitude in accordance with a given signal comprising the combination of a transistor including an input electrode, an output electrode and a common electrode, and a current path between said output electrode and said common electrode capable of supporting bidirectional current flow when rendered conductive, means for providing a bias in the forward direction between said input electrode and said common electrode to render said current path conductive, means for varying said bias in accordance with the given signal, and means for symmetrically applying said carrier wave energy between said output electrode and said common electrode such that the current in said current path flows in respectively opposite directions throughout successive half cycles of the applied carrier waves, said bias varying means controlling the impedance of said current path in accordance with the given signal throughout successive half cycles of the applied carrier waves.

4. In a signalling system including a source of carrier wave energy and a source of modulating signals, a modulator comprising the combination of a symmetrical junction transistor having a base electrode and a pair of additional electrodes, said transistor providing a variable impedance current path between said pair of additional electrodes, biasing means coupled to said base electrode for rendering said current path conductive, means for symmetrically energizing said current path with said carrier wave energy such that the current in said current path flows in respectively opposite directions throughout successive half cycles of said energizing carrier waves, and means for controlling the impedance of said current path in accordance with said modulating signals throughout successive half cycles of said energizing carrier waves, said last named means comprising means for applying said modulating signals to said base electrode.

References Cited in the file of this patent

UNITED STATES PATENTS

| | | |
|---|---|---|
| 2,167,535 | Strong et al. | July 25, 1939 |
| 2,486,776 | Barney | Nov. 1, 1949 |
| 2,569,347 | Shockley | Sept. 25, 1951 |
| 2,570,978 | Pfann | Oct. 9, 1951 |
| 2,600,500 | Haynes | June 17, 1952 |
| 2,620,448 | Wallace | Dec. 2, 1952 |
| 2,644,892 | Gehman | July 7, 1953 |
| 2,657,360 | Wallace | Oct. 27, 1953 |